United States Patent [19]
Mogi

[11] 4,305,065
[45] Dec. 8, 1981

[54] KEY INPUT CIRCUIT
[75] Inventor: Takao Mogi, Tokyo, Japan
[73] Assignee: Sony Corporation, Tokyo, Japan
[21] Appl. No.: 94,113
[22] Filed: Nov. 14, 1979

[30] Foreign Application Priority Data
Nov. 29, 1978 [JP]  Japan ................ 53-148068

[51] Int. Cl.³ .................. G08C 9/00; G06F 7/38
[52] U.S. Cl. ........................ 340/365 S; 364/707
[58] Field of Search ......... 340/365 R, 365 S, 365 E;
364/707; 178/18, 19; 179/90 K, 18 GF

[56] References Cited
U.S. PATENT DOCUMENTS
4,109,315  8/1978  Pan ........................ 240/365 S
4,179,588 12/1979  Oliveira .................. 179/90 K OTHER PUBLICATIONS
Zabierowski, J., "8 Standard TTLs Form Full ASC11 Keyboard Encoder" *Electronic Engineering*, pp. 33-35, Sep. 1978.

*Primary Examiner*—Thomas A. Robinson
*Attorney, Agent, or Firm*—Lewis H. Eslinger; Alvin Sinderbrand

[57] ABSTRACT

A key input circuit includes a matrix array of key switches, a scanning signal generator, and an output circuit that provides a key output signal, whenever any of the key switches is depressed, as an indication of the key switch that is so depressed. The key input circuit also includes a gating circuit for selectively enabling the scanning signal generator so that the latter only supplies a scanning signal to the key switches if one of the key switches is depressed, and ceases to supply the scanning signal when all of the key switches are released, thereby eliminating the unnecessary generation of the scanning signal as a source of signal interference.

6 Claims, 2 Drawing Figures

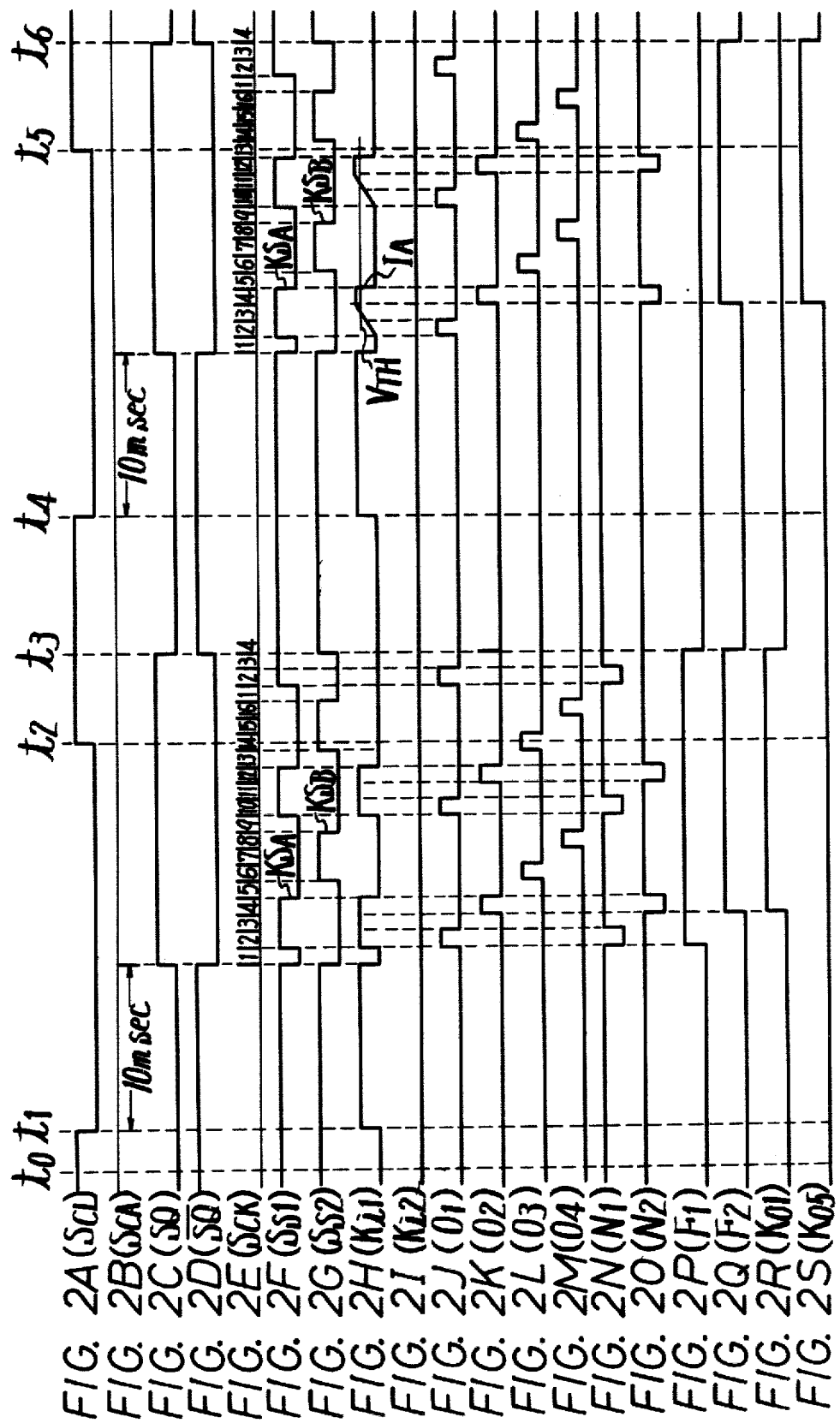

4,305,065

KEY INPUT CIRCUIT

BACKGROUND OF THE INVENTION

1. Field of the Invention

This invention relates to a key input circuit, and particularly relates to a key input circuit in which key switches are arranged in a matrix array, and the depression of one of the key switches is detected by means of a key scanning signal.

2. Description of the Prior Art

Heretofore, it has been proposed to provide a key input circuit which comprises a group of key matrix switches in which longitudinal lines and transverse lines are connectable with each other by means of key switches, and in which the longitudinal lines, for example, are scanned by a key scanning signal provided from a key scan signal input terminal so as to discriminate the key switch that is being closed, or actuated to its "ON" condition and to obtain a key input signal corresponding to the key scan signal at that transverse line which is connected to the closed key switch. The key input signal thus obtained is supplied to a receiving circuit which, in turn, provides a key output signal indicative of the key switch which is closed.

Such a key input circuit has the disadvantage that since the key scan signal is continuously supplied to the group of key matrix switches even when no key is being operated, the key scan signal is needlessly radiated, and can interfere with the correct operation of other circuits.

OBJECTS AND SUMMARY OF THE INVENTION

An object of the invention, therefore, is to provide a key input circuit which can supply a key scan signal to a group of key matrix switches only when a key switch is closed, so that the key scan signal does not needlessly radiate to the other circuits.

According to an aspect of this invention, a key input circuit includes a matrix array of key switches, a scanning signal generator, an output circuit that provides a key output signal whenever any of the key switches is depressed as an indication of the key switch that is so depressed, and a gating circuit to selectively enable the scanning signal generator so that the latter only supplies a scanning signal to the key switches if one of the key switches is depressed, and ceases to supply the scanning signal when all of the key switches are released, thereby preventing the unnecessary generation of the scanning signal and eliminating such unnecessary scanning signal as a source of signal interference.

Further objects and advantages of the invention will be fully understood from the following detailed description with reference to the accompanying drawings.

BRIEF DESCRIPTION OF THE DRAWINGS

FIG. 2 is a time chart illustrating the operation of the embodiment of the key input circuit shown in FIG. 1.

DESCRIPTION OF ONE PREFERRED EMBODIMENT

Figure 1:
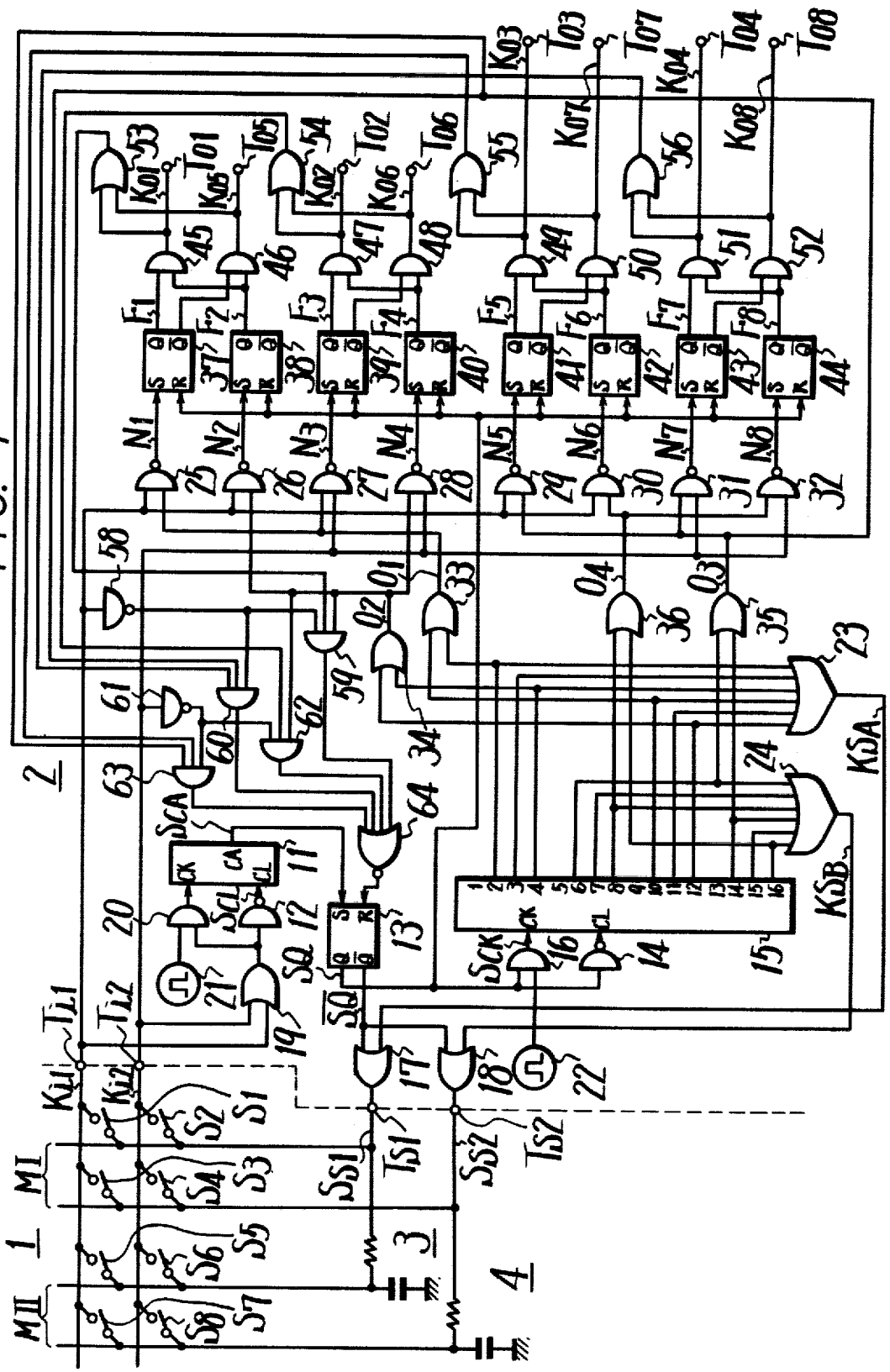
FIG. 1 is a schematic diagram of one embodiment of a key input circuit according to the invention.

One embodiment of a key input circuit according to the invention is shown in FIG. 1. This embodiment can increase the number of key inputs without necessitating an increase in both the number of key scan signal input terminals and the number of key input signal output terminals.

Referring to FIG. 1, reference numeral 1 designates a key input circuit, MI a first group of key matrix switches, MII a second group of key matrix switches, $T_{i1}$ and $T_{i2}$ key input signal output terminals common to both the first and second groups MI and MII, respectively, and $T_{s1}$ and $T_{s2}$ key scan signal input terminals common to both the first and second groups MI and MII, respectively. For the sake of simplicity, in the illustrated embodiment the simplest possible key matrix array—a two-by-two matrix—is used, for which, two input signal output terminals and two key scan signal input terminals are provided, and the first and second groups of key matrix switches MI and MII each require four key switches.

In the illustrated embodiment, the first key matrix switch group MI is directly supplied with key scan signals from the key scan signal input terminals $T_{s1}$ and $T_{s2}$, while the second key matrix switch groups MII are supplied with integrated versions of the key scan signals fed from the key scan signal input terminals $T_{s1}$ and $T_{s2}$ through integration circuits 3 and 4, respectively.

In FIG. 1, reference numeral 2 designates a receiving circuit for receiving key input signals. Such a receiving circuit is usually constructed as an integrated circuit.

In this receiving circuit 2, reference numeral 11 designates a counter which is reset whenever a clear terminal CL thereof receives a signal at a "1" level.

As shown in FIGS. 2H and 2I, at a time to before any of the key switches is depressed, both key input signals $K_{i1}$ and $k_{i2}$ appearing at the key input signal output terminals $T_{i1}$ and $T_{i2}$ are "0". These signals $K_{i1}$ and $K_{i2}$ are applied through an OR circuit to an inverter 12 so that the output $S_{CL}$ (FIG. 2A) of the latter becomes a "1" to reset the counter 11. As a result, a flipflop circuit 13 whose set terminal S is connected with counter 11 is not caused to be set, but is held at its reset condition. One output SQ (FIG. 2C) of the flipflop circuit 13; which is at "0" at time $t_1$ is supplied through an inverter 14 to a clear terminal CL of a counter 15 so as to reset the latter. The output SQ is also supplied to an AND circuit 16 at one input terminal thereof. A clock 22 is connected with the AND circuit 16, but clock pulses are not supplied to the counter 15 so long as the output SQ is "0".

As shown in FIG. 2D, the other, complementary output $\overline{SQ}$ of the flip-flop circuit 13, "1" at time $t_{o1}$ is supplied through OR circuits 17 and 18 to the key scan signal input terminals $T_{s1}$ and $T_{s2}$, respectively. As a result, signals $S_{s1}$ and $S_{s2}$ (FIGS. 2F and 2G) which appear at the terminals $T_{s1}$ and $T_{s2}$ remain at "1" and no Key scan signal is provided to the key matrices MI and MII so long as none of the key switches is depressed.

Under such condition, if any key switch is depressed so as to close at a time $t_1$, the signals $S_{s1}$ and $S_{s2}$ which are "1" cause the signal $K_{i1}$ or $K_{i2}$ ($K_{if}$ in FIGS. 1 and 2) to become "1". As a result, the signal $K_{i1}$ or $K_{i2}$ is supplied through the OR circuit 19 to the inverter 12 and to an AND circuit 20. Thus, the output $S_{CL}$ from the inverter 12 becomes "0" to release the counter 11 from its reset condition. At the same time, clock pulses having a recurrent frequency of 1 KHz, for example, are supplied from a clock pulse oscillator 21 through the AND circuit 20 to the counter 11 at its clock input terminal CK. The counter 11 provides a carry pulse $S_{CA}$ (FIG. 2B) after it has counted ten clock pulses. The carry pulse $S_{CA}$ is applied to the set terminal of flipflop circuit 13 and causes it to set. As a result, the output SQ and the complementary output $\overline{SQ}$ from the flipflop 13 are inverted to "1" and 37 0", respectively. Consequently, the output from the inverter 14 becomes "0" to release the counter 15 from its reset condition. At the same time, clock pulse $S_{CK}$ having a recurring frequency of 1 KHz, for example, (FIG. 2E) is supplied from a clock pulse generator 22 through the AND circuit 16 to the counter 15.

The counter 15 may be of a ring counter, for example, and arranged to supply from its terminals 1, 2, - - - 16 output pulses each of which becomes "1" during successive 1 m sec. intervals in the order as mentioned above.

Signals provided from output terminals 2, 3, 4 and from output terminals 10, 11, 12 of the counter 15 are supplied to an OR circuit 23 to obtain a pulse $KS_A$ having a width of 3 m sec. The pulse $KS_A$ is applied through the OR circuit 17 to the input terminal $T_{S1}$. In addition, signals provided from output terminals 6, 7, 8 and from output terminals 14, 15, 16 of the counter 15 are supplied to an OR circuit 24 to obtain a pulse $KS_B$ having a width of 3 m sec. The period of the pulse $KS_A$ is equal to that of the pulse $KS_B$ but the pulses $KS_A$, $KS_B$ are separated in time so that the period during which the pulse $KB_A$ is "1" does not overlap the period during which the pulse $KS_B$ is "1". The pulse $KS_B$ is supplied through the OR circuit 18 to the input terminal $T_{s2}$.

As a result, the signals $S_{s1}$ and $S_{s2}$ appearing at the input terminals $T_{s1}$ and $T_{s2}$, respectively, consist of key scan signals obtained after the lapse of 10 m sec from a time at which the key switch is depressed. These key scan signals are composed of the pulses $KS_A$ and $KS_B$, respectively.

At the same time, the signals provided from the output terminals 2 and 10 of counter 15 are supplied to an OR circuit 33 to obtain a signal $O_1$ (FIG. 2J) corresponding to the timing of the front edge of the pulse $KS_A$. Similarly, the signals provided from the output terminals 4 and 12 are supplied to an OR circuit 34 to obtain a signal $O_2$ (FIG. 2K) corresponding to the timing of the rear edge of the pulse $KS_A$. In the same fashion the signals provided from the output terminals 6 and 14 are supplied to an OR circuit 35 to obtain a signal $O_3$ (FIG. 2L) corresponding to the timing of the front edge of the pulse $KS_B$ and the signals provided from the output terminals 8 and 16 are supplied to an OR circuit 36 to obtain a signal $O_4$ (FIG. 2M) corresponding to the timing of the rear edge of the pulse $KS_B$.

The signal $K_{i1}$ appearing at the terminal $T_{i1}$ is supplied to NAND circuits 25, 26, 29 and 30 and the signal $K_{i2}$ appearing at the terminal $T_{i2}$ is supplied to NAND circuits 27, 28, 31 and 32. The output signal $O_1$ from the OR circuit 33 is supplied to the NAND circuits 25 and 27 so that the latter each respond to the front edge of the pulse $KS_A$ while the output signal $O_2$ from the OR circuit 34 is supplied to the NAND circuits 26 and 28 so that such NAND circuits respond to the rear edge of the pulse $KS_A$. Similarly, the output signal $O_3$ from the OR circuit 35 is supplied to the NAND circuits 29 and 31 and the output signal $O_4$ from the OR circuit 36 is supplied to the NAND circuits 30 and 32 so that NAND circuits 29,31 and 30,32 respond to the front edge and the rear edge of the pulse $KS_B$, respectively.

Let it be assumed that a key switch being closed at the instant $t_1$ is a key switch $S_1$ belonging to the first matrix switch group MI. Thus, the signal $K_{i1}$ at the terminal $T_{i1}$ becomes "1" at the instant $t_1$ and after the lapse of 10 m sec from the instant $t_1$ the Key scan pulse $KS_A$ appears in the signal $S_{s1}$ at the terminal $T_{s1}$ and also appears, as part of the signal $K_{i1}$ at the terminal $T_{i1}$.

The front edge of the pulse $KS_A$ is detected by the NAND circuit 25 whose output $N_1$ (FIG. 2N) goes to "0" and thereby sets an associated flipflop circuit 37, making one of its outputs $F_1$ (FIG. 2P) "1". In addition, the rear edge of the pulse $KS_A$ is detected by the NAND circuit 26 whose output $N_2$ (FIG. 2O) goes to "0" and sets a flipflop 38 associated with it, thereby making one of its outputs $F_2$ (FIG. 2Q) "1".

The outputs $F_1$ and $F_2$ are supplied to an AND circuit 45 which provides a logic sum of these outputs $F_1$ and $F_2$ in the form of a key output signal $K_{o1}$ (FIG. 2R) supplied to a Key output terminal $T_{o1}$. Thus, if the key switch $S_1$ is closed, the key output signal $K_{o1}$ is delivered to the output terminal $T_{o1}$ It is seen that there is a one-to-one correspondence between the key switches $S_1$–$S_4$ and the respective key output signals $K_{o1}$–$K_{o4}$.

At an instant $t_2$, if a user separates his hand from the key switch $S_1$ so that it opens, the signal $K_{i1}$ at the terminal $T_{i1}$ becomes "0". As a result, the output $S_{CL}$ from the inverter 12 becomes "1", thereby resetting the counter 11.

At the same time, because the key switch $S_1$ is open and the signal $K_{i1}$ is "0", an inverter 58 provides a "1" output. Since the key output signal delivered from the output terminal $T_{o1}$ is "1", an output from an OR circuit 53 to which the signal $K_{o1}$ is provided also becomes "1". Such output, together with the output from the inverter 58 is supplied to an AND circuit 59 which is also supplied, with the output $O_2$ from the OR circuit 34. As a result, the output from the AND circuit 59 rises to "1" at a time $t_3$ that the output $O_2$ becomes "1" after the key switch $S_1$ has been opened. The output from the AND circuit 59 is supplied through a NOR circuit 64 to a reset terminal R of the flipflop 13 to reset it so that its one output SQ is "0", and its other output $\overline{SQ}$ is "1".

As soon as the one output SQ of the flipflop 13 becomes "0", the supply of clock pulse $S_{CK}$ to the counter 15 ceases and at the same time the counter 15 is reset. In addition, when the output SQ goes to "0", all of the flipflop circuits 37 to 44, adapted to provide the Key output signals $K_{o1}$–$K_{o8}$, are reset.

Concurrently with this the other output $\overline{SQ}$ from the flip-flop 13 becomes "1", and the output from the OR circuits 17 and 18 and hence the signals $S_{s1}$ and $S_{s2}$ are held at "1", thereby stopping the Key scan signals.

Later, if a Key switch $S_5$ belonging to the second matrix switch group MII is closed at a time $t_4$ as shown in FIG. 2, the carry pulse $S_{CA}$ is delivered from the counter 11 after the lapse of 10 m sec from the instant $t_4$ so that the key scanning begins from the time of the carry pulse $S_{CA}$.

In this case, since it is a Key switch $S_5$ from the key matrix group MII that is closed, the signal $K_{i1}$ (FIG. 2H) delivered from the terminal $T_{i1}$ is a signal $I_A$ that is obtained by integrating the pulse $KS_A$ in the integration circuit 3. The level of the signal $I_A$ is lower than a threshold level $V_{TH}$ at the time corresponding to the front edge of the pulse $KS_A$ so that the NAND circuit 25 does not detect the front edge of the signal $I_A$. Nevertheless, the level of the rear edge of the signal $I_A$ is higher than the threshold level $V_{TH}$ so that the NAND circuit 26 can detect the rear edge of the signal $I_A$ and provide as its output $N_2$ a pulse which goes to "0", thereby setting the flipflop circuit 38. In this case, the AND circuit 45 functions to obtain a logic sum of the inverse of the output $F_2$ from the flipflop circuit 38 and the output $F_1$ from the flipflop circuit 37, thereby obtaining a key output signal $K_{o5}$ (FIG. 2S) which appears at an output terminal $T_{o5}$. Here it is seen that, if the Key switch $S_5$ is closed, the Key output signal $K_{o5}$ becomes "1", and that there is a one-to-one correspondence between the key switches $S_5$–$S_8$ and the respective key output signals $K_{o5}$–$K_{o8}$.

At an instant $t_5$, if the user's hand is separated from the Key switch $S_5$ so that the Key switch $S_5$ opens, at an time $t_6$ thereafter at which the output $O_2$ from the OR circuit 34 becomes "1", a reset pulse is provided from the output terminal of the AND circuit 59 and applied through the NOR circuit 64 to the flipflop circuit 13 so as to reset it. Thus the key scan signals cease in the same manner as at time $t_3$, and one Key operation is thereby completed.

Similar to the above, if a Key switch $S_2$ belonging to the first group MI is closed, the front and rear edges of the pulse $KS_B$ are detected by the NAND circuits 27 and 28, respectively. The outputs $N_3$ and $N_4$ thus detected cause both the flipflops 39 and 40 to set and the logic sum of the outputs $F_3$ and $F_4$ from the flipflops 39 and 40 provided via AND circuit 47 becomes "1" thereby providing key output signal $K_{o2}$, from an output terminal $T_{o2}$ corresponding to the Key switch $S_2$. Likewise, if a Key switch $S_6$ belonging to the second group MII is closed, the rear edge only of the integrated signal of the pulse $KS_B$ is detected by the NAND circuit 28. The output $N_4$ thus detected causes the flipflop 40 only to set, and, as a result the key output signal $K_{o6}$ becomes "1" and appears at an output terminal $T_{o6}$ corresponding to the Key switch $S_6$.

Similarly also if Key switch $S_3$, $S_4$, $S_7$, or $S_8$ is closed, a key output signal $K_{o3}$, $K_{o4}$, $K_{o7}$, or $K_{o8}$ is provided from a respective output terminal $T_{o3}$, $T_{o4}$, $T_{o7}$, or $T_{o8}$.

When the key output signal $K_{o2}$ or $K_{o6}$ is "1" at the output terminal $T_{o2}$ or $T_{o6}$, the AND circuit 62 provides a logic sum of the "1" output from the OR circuit 54, the signal inverted from the signal $K_{i2}$ by the inverter 61 and the output $O_2$ from the OR circuit 34. When the Key output signal $K_{o3}$ or $K_{o7}$ is "1" at the output terminal $T_{o3}$ or $T_{o7}$, the AND circuit 60 provides a logic sum of the "1" output from the OR circuit 56, the signal inverted from the signal $K_{i1}$ by the inverter 58 and the signal $O_3$ from the OR circuit 35. When the key output signal $K_{o4}$ or $K_{o8}$ is "1" at the output terminal $T_{o4}$ or $T_{o8}$, the AND circuit 63 provides a logic sum of the output from the OR circuit 55, the signal inverted from the signal $K_{i2}$ by the inverter 61 and the output $O_3$ from the OR circuit 35. In each case, whenever the depressed key switch $S_2$–$S_4$ or $S_6$–$S_8$ is released and permitted to open, a reset pulse is provided to the flipflop circuit 13.

As stated above, the invention is operative to stop the supply of key scan signals to key matrix switch groups when key switches are not operated and is operative to effect key scan only when one of the key switches is closed, thereby eliminating unnecessary radiation of the key scan signal and providing interference with any other circuits due to the key scan signal.

In the embodiment shown in FIG. 1, a key scan signal is directly supplied to one of a plurality of key matrix switch groups and the same key scan signal is supplied through an integration circuit to another group.

As a result, the difference in waveform between the key input signals delivered from the key input signal output terminals is discriminated and it is possible to discriminate a plurality of key matrix switch groups from one other. Thus, whereas in a conventional key scanning device, if N key input signal output terminals and M key scan signal input terminals are provided, a maximum number N×M key inputs can be used, the key input circuit according to the present invention can use 2N×M key inputs without increasing the number of key input signal or key scan signal terminals.

It will be apparent that many modifications and variations can be effected by one skilled in the art without departing from the spirit or scope of the present invention which is to be determined by appended claims.

I claim as my invention:

1. A key input circuit comprising a plurality of key switches each actuable between a first and a second condition, said key switches being arranged in a matrix array; scanning signal generating means for supplying a scanning signal to said matrix array of key switches during a scanning operation and supplying a DC level thereto other than during the scanning operation; key output means for providing a key output signal, in response to reception of said DC level, whenever one of said key switches is actuated from its first to its second condition, the key output signal being indicative of the key switch that is so actuated; and gating means for selectively enabling said scanning signal generating means so that the latter supplies said scanning signal to said matrix array in response to an actuation of any one of said key switches to its second condition, and said scanning signal generating means ceases to supply said scanning signal to said matrix array in response to a return of said one key switch to its first condition.

2. A key input circuit according to claim 1, wherein said gating means includes first means for detecting said DC level when any of said key switches is actuated to its second condition; means for supplying an enabling signal to said scanning signal generating means in response to a detected actuation of a key switch to its second condition; and second means for detecting whether said key switch is returned to said first condition and terminating said enabling signal in response to a detected return of said key switch to its first condition.

3. A key input circuit according to claim 2, wherein said first means for detecting includes a counter circuit which, in the absence of actuation of any of said key switches to its second condition, remains set into an inactive state, but which, if one of said key switches is so actuated commences counting and provides a carry signal when it reaches a predetermined count, said carry signal being effective to actuate said means for supplying the enabling signal.

4. A key input circuit according to claim 2, wherein said means for supplying the enabling signal includes a bistable circuit having first and second stable states and providing a first output at levels corresponding to said first and second states, respectively, of the bistable circuit, said bistable circuit being settable into its second state in response to a detected actuation of one of said key switches and resettable into its first state in response to a detected return of said key switch to its first condition, said first output being provided to said scanning signal generating means to enable the same when said bistable circuit is in said second state.

5. A key input circuit according to claim 4, wherein said bistable circuit further has a complementary output corresponding to the complement of said first output of the bistable circuit, and said complementary output is supplied to said matrix array as said DC level to be detected by said first detecting means in response to an actuation of one of said key switches to its second condition.

6. A key input circuit according to claim 4, wherein said second detecting means includes logic means for providing a reset signal to reset said bistable circuit to its first state upon occurrence of said key output signal corresponding to actuation of a key switch to its second condition coincidentally with said scanning signal and then the return of said key switch to its first condition.

* * * * *